United States Patent [19]
Eifuku

[11] Patent Number: 5,749,510
[45] Date of Patent: May 12, 1998

[54] SEMICONDUCTOR CHIP BONDING METHOD

[75] Inventor: Hideki Eifuku, Oomuta, Japan

[73] Assignee: Matsushita Electric Industrial Co., Ltd., Osaka, Japan

[21] Appl. No.: 631,123

[22] Filed: Apr. 12, 1996

[30] Foreign Application Priority Data

Apr. 25, 1995 [JP] Japan ................................ 7-099173

[51] Int. Cl.⁶ ................................................ H01L 21/58
[52] U.S. Cl. ........................................ 228/122.1; 228/253
[58] Field of Search .......................... 228/121.1, 122.1, 228/180.1, 253

[56] References Cited

U.S. PATENT DOCUMENTS 5,523,260  6/1996  Missele ........................... 228/121
5,620,927  4/1997  Lee ................................ 228/180.22

*Primary Examiner*—Kenneth J. Ramsey
*Attorney, Agent, or Firm*—Pollock, Vande Sande & Priddy

[57] ABSTRACT

A chip mounting section "H", defined on a flush surface of a substrate 1, is dissected into a plurality of subsections "E"—"E". Bond 2 is applied within the chip mounting section "H" on the flush surface of substrate 1 in a discrete manner so that a plurality of bonding bumps 2 are arranged within each region of subsection "E". A minimum clearance "L" between two bonding bumps 2, 2 in the same subsection "E" is smaller than a minimum clearance "D" between two bonding bumps 2, 2 belonging to adjacent to subsections "E" and "E". A chip 3 is mounted on plural bonding bumps 2 by applying a force thereon, thereby mashing plural bonding bumps 2 by a bottom surface of chip 3 without causing any void therein.

14 Claims, 10 Drawing Sheets

SEMICONDUCTOR CHIP BONDING METHOD

BACKGROUND OF THE INVENTION

1. Field of the Invention

The present invention generally relates to a semiconductor chip bonding method for bonding a chip on a substrate.

2. Prior Art

A semiconductor chip, cut out or removed from a wafer which is a thin semiconductor slice on which matrices of microcircuits can be fabricated or which can be cut into individual dice for fabricating single transistors and diodes, is generally bonded on a substrate, such as a lead frame or a printed circuit board. Hereinafter, a representative conventional chip bonding method will be explained with reference to FIGS. 10 and 11, where FIG. 10 shows a condition where bond is applied on a substrate in a matrix pattern while FIG. 11 shows a condition where a chip is mounted or placed on the bond. In each of FIGS. 10 and 11, top is a cross-sectional side view taken along a line A—A while bottom is a plan view showing a substrate and an arrangement of bond applied thereon.

In FIG. 10, a substrate 101 has an upper flush surface on which a chip mounting section "H" is defined. A bond 102, denoted as a plurality of spots in the drawing, is applied within the region corresponding to a chip mounting section "H". Each spot of bond 102 has the same volume or amount. Such a bond application can be realized by the use of transfer pin or a dispenser.

After bond 102 is applied on substrate 101 as shown in FIG. 10, a chip 103 is mounted on bond 102 as shown in FIG. 11. In this mounting operation, chip 103 is gently pressed on bond 102. Hence, each spot of bond 102 is mashed and flattened in accordance with the pressing force. Accordingly, each spot of bond 102 shown in FIG. 11 has a larger diameter larger than that of a corresponding spot of bond 102 shown in FIG. 10. The mounting operation of chip 103 onto bond 102 can be performed by an automatic mounting apparatus such as a die-bonder.

A portion 104, depicted by a black area in FIG. 11, represents a void (bubble). Each void 104 is formed in the mounting operation of chip 103 (in the transfer stage from FIG. 10 to FIG. 11). When air fails to escape outside, air is confined in a closed space surrounded by spots of bond 102 provided between chip 103 and substrate 101.

Formation of such voids is generally unallowable in view of the fact that the presence of this kind of void weakens the bonding force between chip 103 and substrate 101. When substrate 101 is practically incorporated into an electronic device, it is usual that chip 103 generates heat due to its internal resistance. When subjected to such heat generation, each void 104 causes a thermal expansion. It may result in the damage of chip 103.

In this respect, the conventional chip bonding method shown in FIGS. 10 and 11 is not desirable. Uniform arrangement of spots of bond 102 increases the tendency that a large amount of void 104 is confined in the closed space between chip 103 and substrate 101, giving an adverse effect to them.

SUMMARY OF THE INVENTION

Accordingly, in view of above-described problems encountered in the prior art, a principal object of the present invention is to provide a novel and excellent chip bonding method capable of eliminating or suppressing the generation of voids.

In order to accomplish this and other related objects, the present invention provides a novel and excellent method of bonding a chip on a substrate, comprising steps of: dissecting a chip mounting section defined on a flush surface of the substrate into a plurality of subsections; applying bond within the chip mounting section on the flush surface of the substrate in a discrete manner so that a plurality of bonding bumps are arranged within each region of the subsections, wherein a minimum clearance between two bonding bumps in the same subsection being smaller than a minimum clearance between two bonding bumps belonging to adjacent to subsections; and mounting a chip on the plurality of bonding bumps by applying a force thereon, thereby mashing the plurality of bonding bumps by a bottom surface of the chip.

According to the features of preferred embodiments of the present invention, the chip mounting section defined on the flush surface of the substrate is a square region. The chip mounting section is dissected into the plural subsections in a predetermined matrix pattern. The matrix pattern comprises the same number of rows and lines. Each of subsections is a right square. The plural bonding bumps arranged within each region of the subsections are arranged in a predetermined matrix pattern. The plural bonding bumps arranged within each region of the subsections consist of a central bonding bump and a plurality of surrounding bonding bumps disposed symmetrically about the central bonding bump. The central bonding bump is different in size from the surrounding bonding bumps.

In one preferable embodiment, the central bonding bump is larger in size than the surrounding bonding bumps, and a total of eight surrounding bonding bumps are disposed around the central bonding bump so as to form a matrix pattern consisting of three rows and three lines.

In another preferable embodiment, the central bonding bump is smaller in size than the surrounding bonding bumps, and a total of four surrounding bonding bumps are disposed in a matrix pattern of two rows and two lines so as to surround the central bonding bump. In this case, it is preferable that a minimum clearance between the central bonding bump and each of the surrounding bonding bump is smaller than a minimum clearance between two surrounding bonding bumps.

Furthermore, according to the preferred embodiments of the present invention, the plural bonding bumps are formed into a semi-spherical shape. The minimum clearance between two bonding bumps in the same subsection is a minimum clearance between two bonding bumps having the same size.

Still further, in another preferred embodiment of the present invention, the subsections comprises first and second subsections, the first subsection comprises a first central bonding bump larger than each of first surrounding bonding bumps disposed symmetrically about the first central bonding bump, while the second subsection comprises a second central bonding bump smaller than each of second surrounding bonding bumps disposed symmetrically about the second central bonding bump.

BRIEF DESCRIPTION OF THE DRAWINGS

The above and other objects, features and advantages of the present invention will become more apparent from the following detailed description which is to be read in conjunction with the accompanying drawings, in which.

DETAILED DESCRIPTION OF THE PREFERRED EMBODIMENTS

Figure 1:
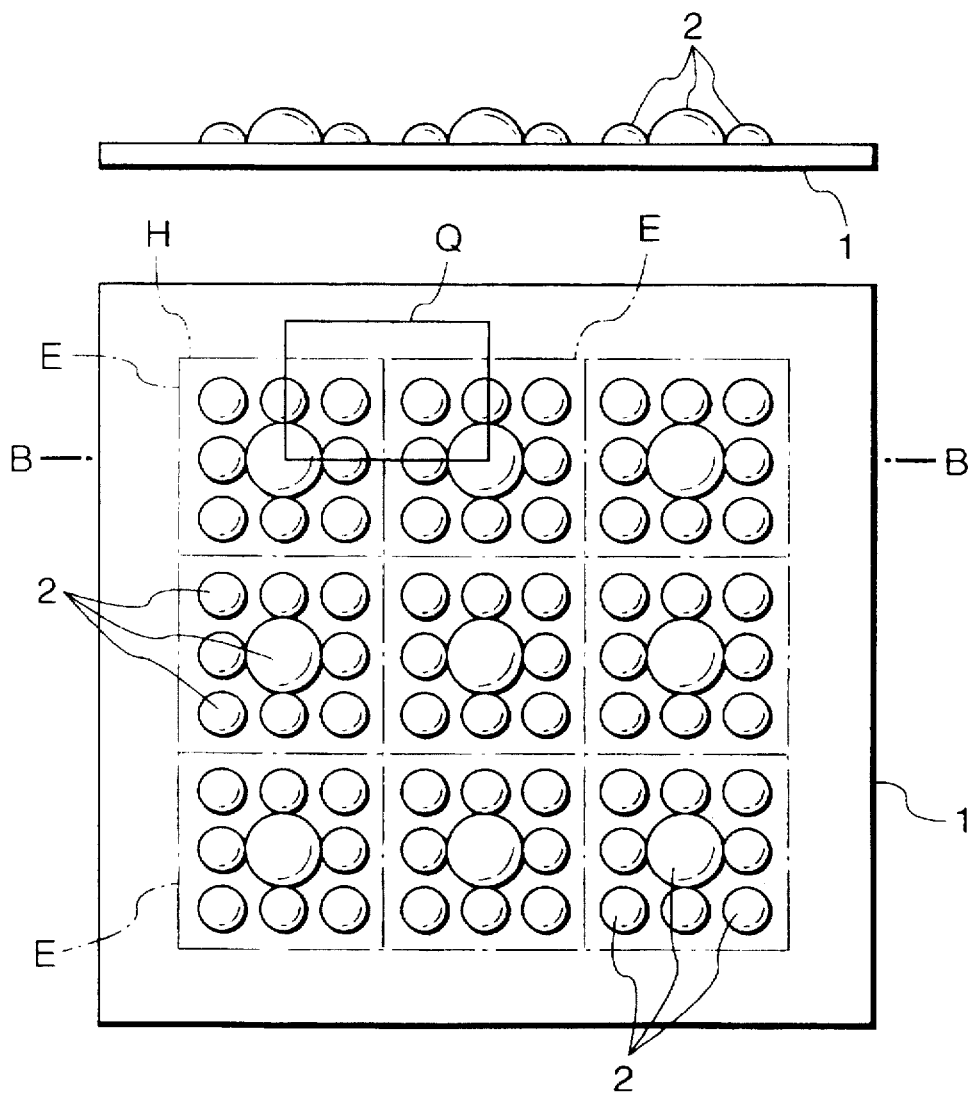
FIG. 1 is a composite view illustrating a step of a chip bonding method in accordance with a first embodiment of the present invention, wherein top is a cross-sectional side view taken along a line B—B while bottom is a plan view showing a substrate and an arrangement of bond applied thereon.

Preferred embodiments of the present invention will be explained in greater detail hereinafter, with reference to the accompanying drawings. Identical parts are denoted by an identical reference numeral throughout views.

Figure 3:
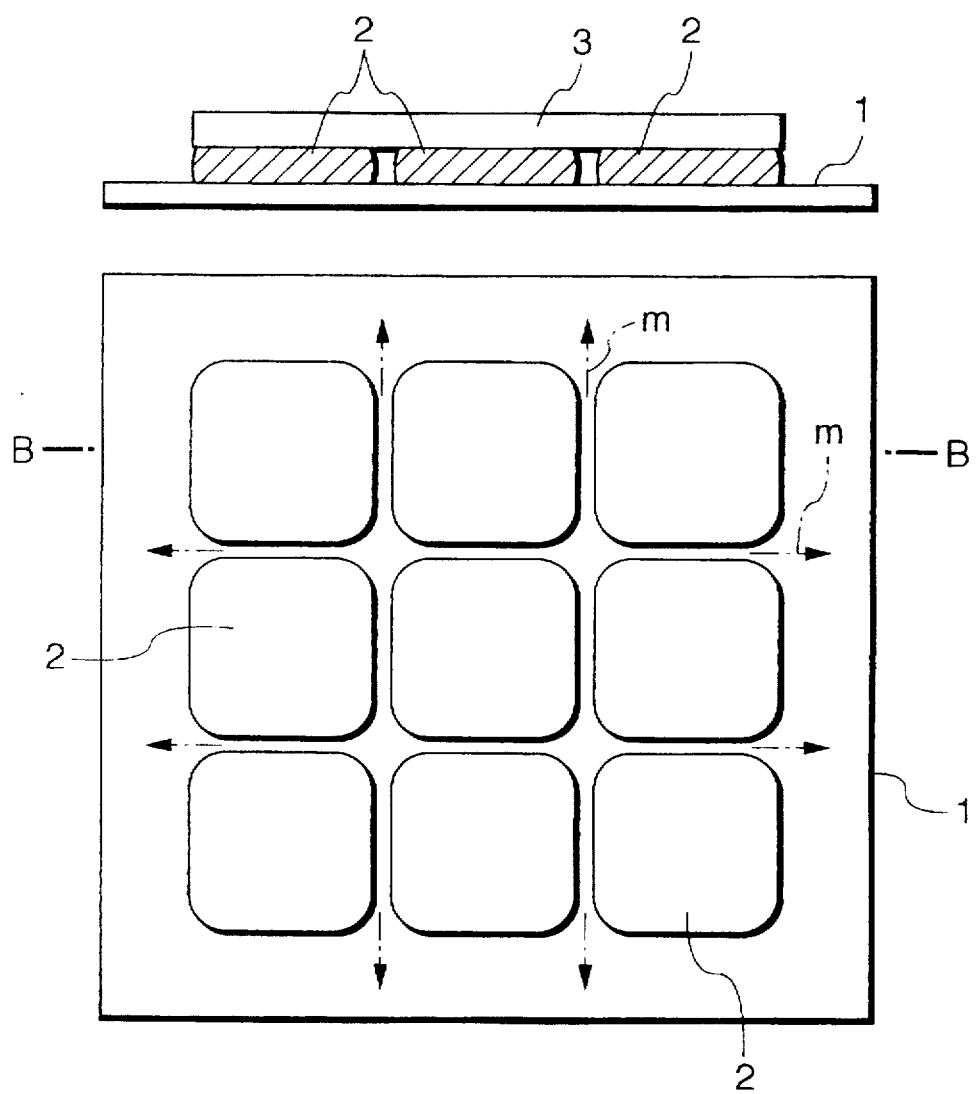
FIG. 3 is a composite view illustrating still another step of the chip bonding method in accordance with the first embodiment of the present invention, wherein top is a cross-sectional side view taken along the line B—B while bottom is a plan view showing the substrate and a momentary condition of the bond applied thereon.
Figure 4:
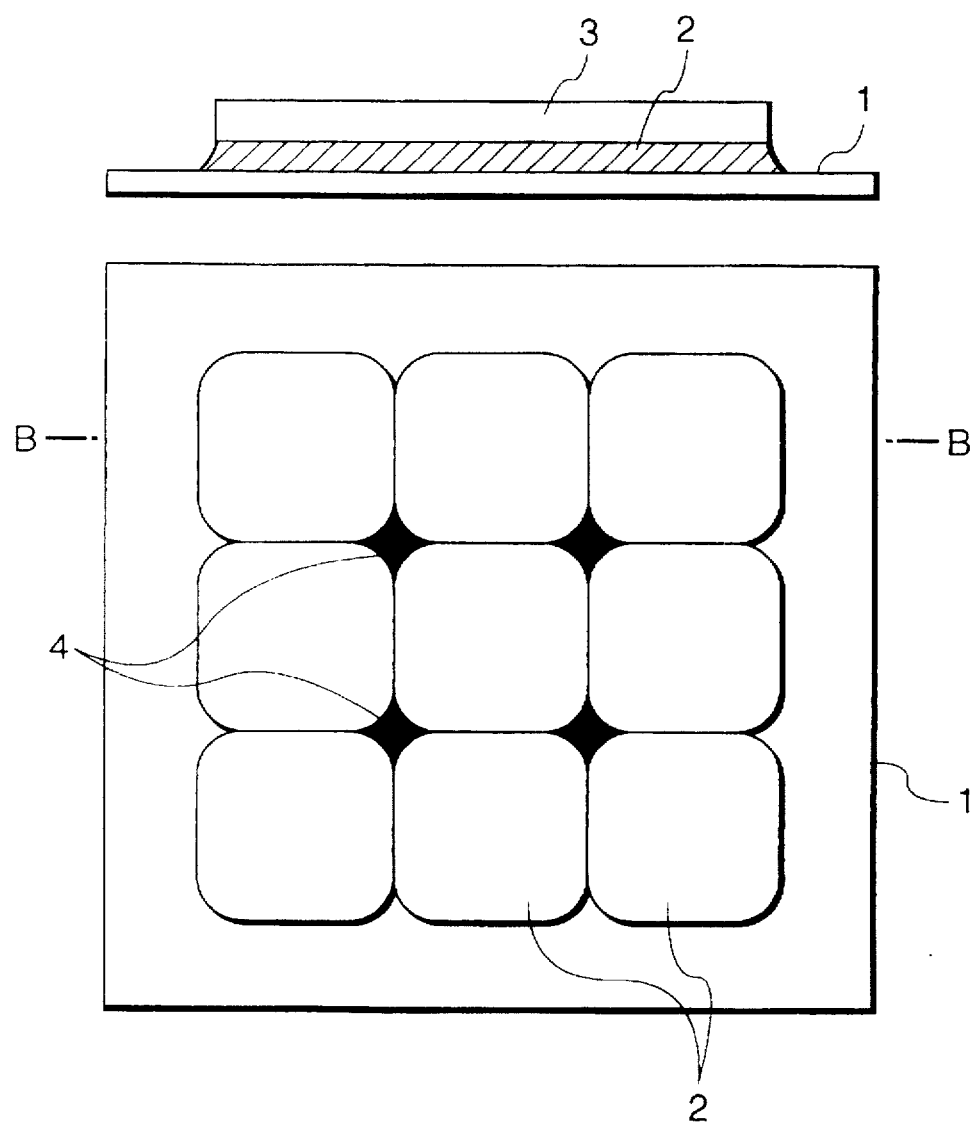
FIG. 4 is a composite view illustrating yet another step of the chip bonding method in accordance with the first embodiment of the present invention, wherein top is a cross-sectional side view taken along the line B—B while bottom is a plan view showing the substrate and a final condition of the bond applied thereon.
Figure 5:
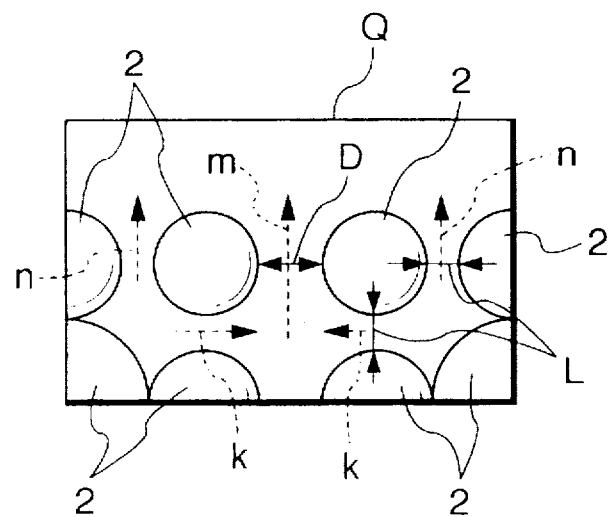
FIG. 5 is an enlarged view showing a characteristic part of the bonding in the chip bonding method in accordance with the first embodiment of the present invention.

FIGS. 1 to 4 illustrate sequential steps of the chip bonding method in accordance with the first embodiment of the present invention, covering discrete application of bond to completion of a chip bonding operation. Each drawing comprises a combination of top and bottom views. Top is a cross-sectional side view taken along a line B—B. Bottom is a plan view showing a substrate on which bond is applied discretely in a predetermined pattern in accordance with the present invention. FIG. 5 is an enlarged view showing a part "Q" of FIG. 1, wherein the discrete bond application pattern is illustrated characteristically.

Next, the chip bonding method will be explained in accordance with the first embodiment of the present invention. First, as shown in FIG. 1, a plurality of semi-spherical bumps of bond 2 (hereinafter referred to as "bonding bumps") are discretely arranged in a predetermined matrix pattern within a square chip mounting section "H" on a flush surface on a substrate 1. More specifically, the square chip mounting section "H" is dissected into a plurality of subsections "E". According to the first embodiment, the square chip mounting section "H" is divided into three rows and three lines so as to form a total of nine square subsections "E"—"E", each being a right square having the same size.

Each subsection "E" comprises a total of nine semi-spherical bonding bumps 2 applied on the upper flush surface thereof, disposed discretely in a predetermined matrix pattern. This matrix pattern consists of three rows and three lines. Among nine bonding bumps 2 in each subsection "E", a central bonding bump 2 is larger than surrounding eight bonding bumps 2 which are symmetrically arranged about the central bonding bump 2.

An application amount of bond is finely controlled by an appropriate application apparatus which will be later described with reference to FIGS. 6 and 7, so as to differentiate (enlarge) the size of a semi-spherical shape of only the central bonding bump 2 compared with the remainder (surrounding eight smaller semi-spherical bonding bumps 2).

FIG. 5 shows the characteristic positional relationship between semi-spherical bonding bumps 2 applied on substrate 1. A distance "D" represents a minimum clearance of two semi-spherical bonding bumps 2 and 2, when these two belong to different subsections "E" and "E" next to each other and are the most closest bumps 2 between these two subsections "E" and "E". A distance "L" represents a minimum clearance of two semi-spherical bonding bumps 2 and 2 of the same size, when these two belong to the same subsection "E" and are same in size (i.e. adjacent two of surrounding bonding bumps 2). According to the first embodiment of the present invention, the minimum clearance "D" is set longer than the minimum clearance "L".

Figure 2:
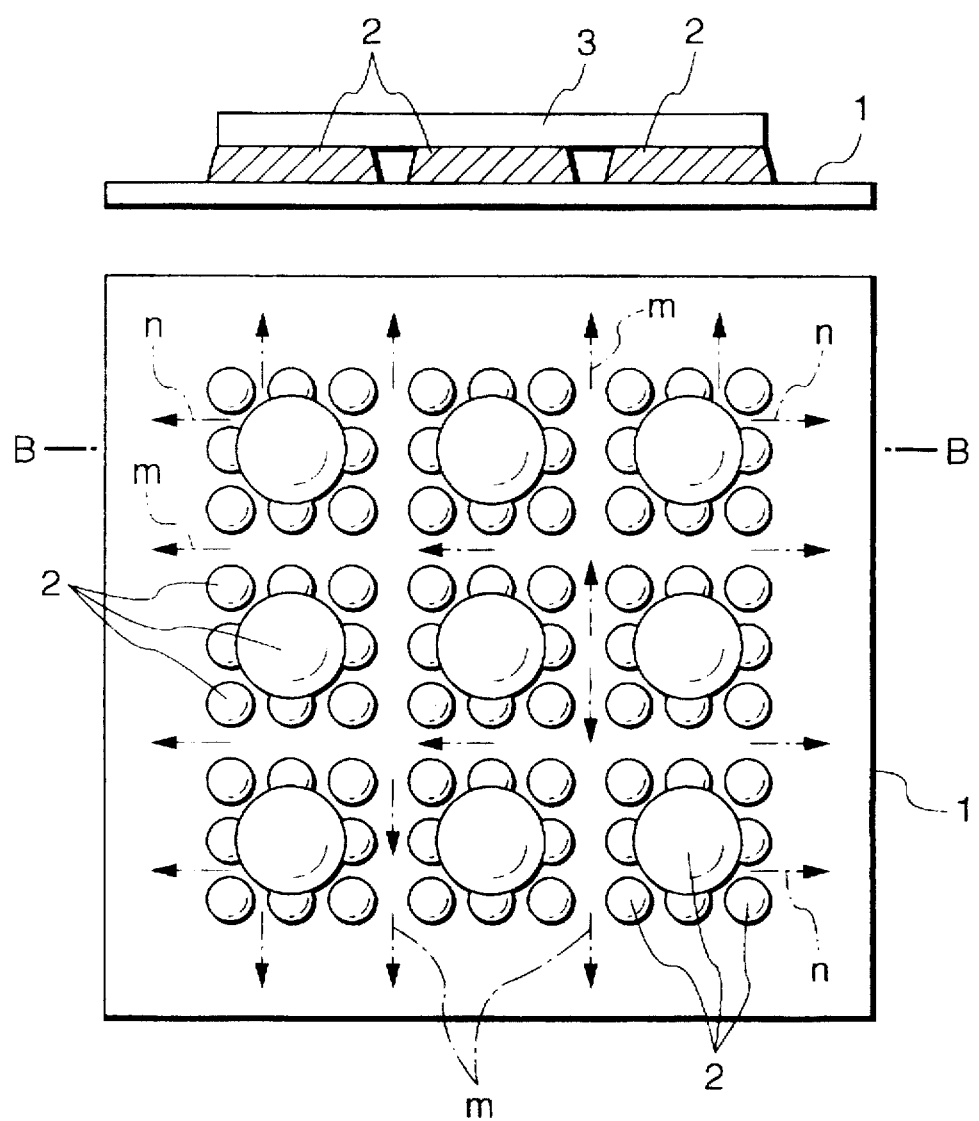
FIG. 2 is a composite view illustrating another step of the chip bonding method in accordance with the first embodiment of the present invention, wherein top is a cross-sectional side view taken along the line B—B while bottom is a plan view showing the substrate and a momentary condition of the bond applied thereon.

After bond 2 is discretely applied on substrate 1 in the predetermined matrix pattern as shown in FIG. 1, a chip 3 is mounted on bond 2 with a pressing force applied thereon. FIG. 2 shows a condition of bond 2 immediately after chip 3 is mounted on bond 2, where only the central bonding bump 2 is first mashed by the lower surface of chip 3. By keeping a pressing force applied on chip 3, the remaining surrounding bonding bumps 2 are flattened together with the central bonding bump 2, as shown in FIG. 3. Then, upon termination of flat expansion of each bonding bump 2, all the bonding bumps 2 are finally merged into a united block as shown in FIG. 4. Thus, chip 3 is firmly bonded on substrate 1.

In FIGS. 2 and 3, broken arrows "n" and "m" respectively show the flow of air. In FIG. 2, air is pushed out through aisles or passages defined by minimum clearances "L" and "D" when the bond 2 is pressed by the chip 3. FIG. 5 shows the details of such an air flow. As the central bonding bump 2 is larger in height than the surrounding bonding bumps 2 in each subsection "E", the central semi-spherical bonding bump 2 is first mashed and is flattened widely. Hence, in each subsection "E", air is pushed out toward a wider aisle or passage having minimum clearance "D" through a narrower aisle or passage having minimum clearance "L" along arrow "k", or directly pushed out to the outside through a narrower aisle or passage communicating with the outside along arrow "n". The air, having been once pushed out to the wider aisle, is then pushed out to the outside along arrow "m" even after the narrower aisles are eliminated completely.

In this manner, successively pushing out inside air, all (a total of nine) semi-spherical bonding bumps 2 in each subsection "E" are completely united without causing any void therebetween, as shown in FIG. 3. Then, air is pushed out through the wider aisle (along arrow "m"). Finally, as shown in FIG. 4, the united bonding block in each subsection "E" is brought into contact with another united bonding block in an adjacent subsection "E". Air, if it fails to escape to the outside, will be confined at a closed corner among four bonding blocks. The void 4, thus formed, is so small in volume that no substantial adverse effect is given to the chip 3 and the substrate 1.

With the settings of clearances "D" and "L" described above, air can be successfully extracted or discharged from the inside space between chip 3 and substrate 1 to the outside. In a first step, air is pushed out through narrower aisles having a minimum clearance "L". In a second step (after all of bonding bumps 2 are united into one block in each subsection "E"), air is pushed out through wider aisles remaining between adjacent two subsections "E" and "E". Hence, even after the narrower aisles are completely eliminated, air can be continuously guided to the outside through the wider aisles still remaining at this moment. In other words, providing the wider aisle between adjacent two subsections "E" and "E" makes it possible to effectively reduce the residual air void 4 confined in the closed space between chip 3 and substrate 1.

Next, a method of controlling an amount of each semi-spherical bond 2 applied on substrate 1 in a discrete manner will be explained with reference to FIGS. 6 and 7.

Figure 6:
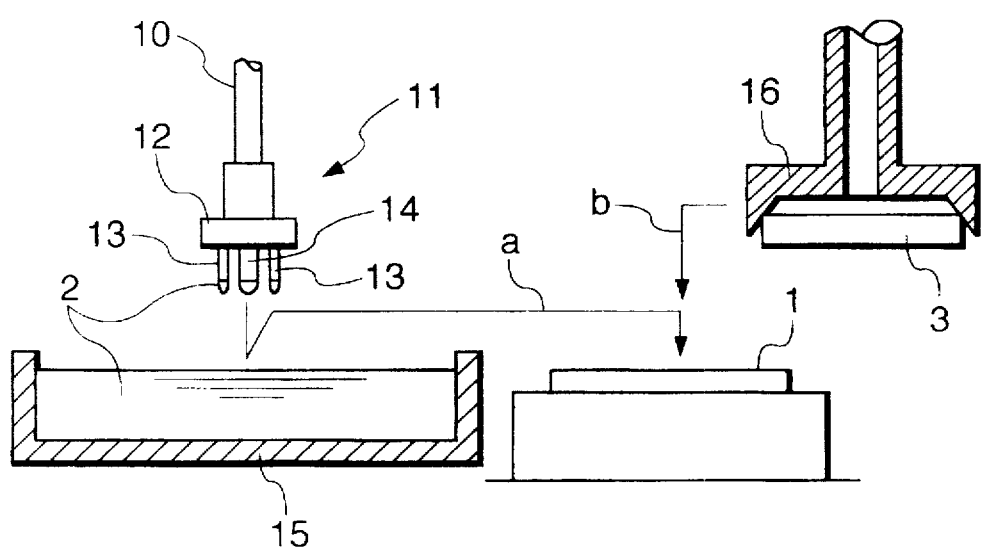
FIG. 6 is a view showing a chip bonding apparatus applicable to each of the embodiments of the present invention.

FIG. 6 shows a chip bonding apparatus applicable to the first embodiment and later-described other embodiments of the present invention.

In FIG. 6, a shaft 10 extends downward and detachably supports a transfer head 11 at the lower end thereof. The transfer head 11, having a function of applying a plurality of bonding bumps 2 discretely in a predetermined matrix pattern, comprises a plurality of transfer pins 13 and 14 extending downward from the bottom thereof. A total of nine transfer pins (eight small transfer pins 12 and a large transfer pin 14) are arranged in a matrix pattern consisting of three rows and three lines with the large transfer pin 14 at the center. The central large transfer pin 14 has a cross-sectional area larger than that of each small transfer pin 14.

A great amount of bond 2 is stored in a bond tray 15. Transfer head 11, after being shifted to a position above this bonding tray 15, is lowered to put bond 2 on the lower surfaces of transfer pins 13 and 14. Next, with bond 2 attached to the lower ends of transfer pins 13 and 14, the transfer head 11 is lifted upward and then shifted to a position above substrate 1 along an arrow "a".

Subsequently, transfer head 11 is lowered to apply or transfer bond 2 to the upper surface of substrate 1, thereby completing the bond application for one subsection "E". The same operation is repeated nine times, forming a total of nine subsections "E" with the predetermined matrix application of bond 2.

Thereafter, the chip 3, absorbed by vacuum at a collet 16 of a die bonder, is mounted on the bonding bumps 2 as shown by an arrow "b".

Figure 7:
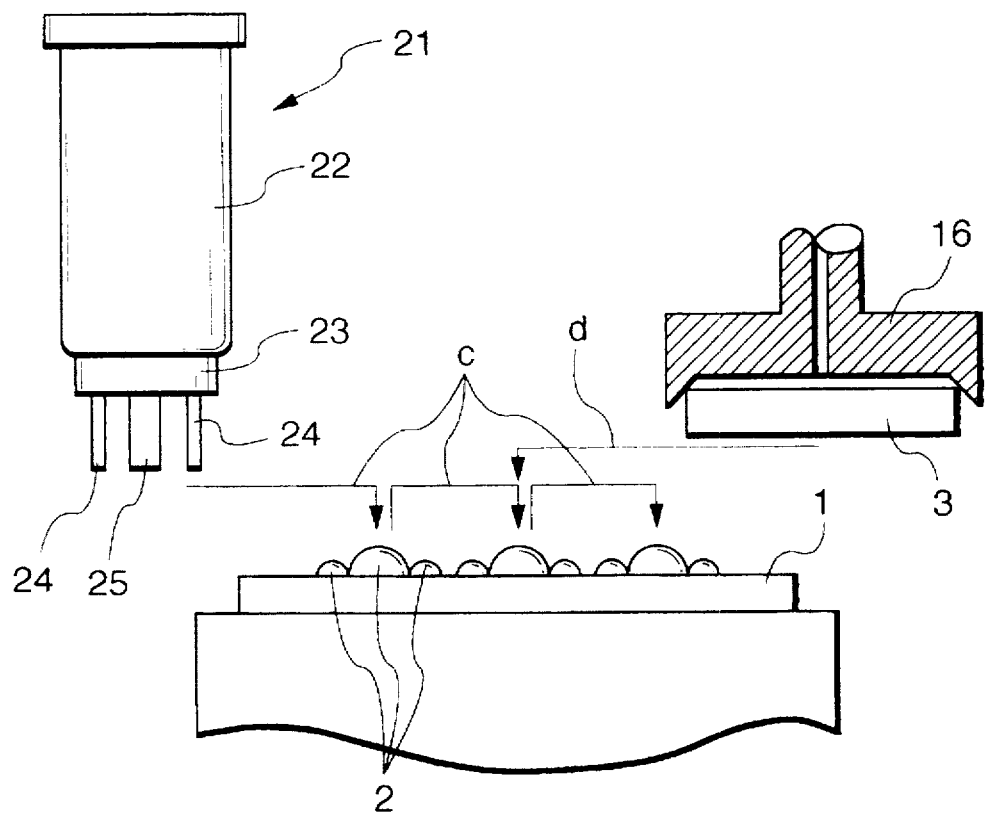
FIG. 7 is a view showing another chip bonding apparatus applicable to each of the embodiments of the present invention.

FIG. 7 shows an another embodiment of the chip bonding apparatus applicable to the embodiments of the present invention. In FIG. 7, a bond applicator head 21 comprises a cylinder 22 containing bond 2 therein and a bond nozzle 23 attached at the bottom of cylinder 22. Bond nozzle 23 has a total of nine hollow needles 24 and 25 (eight small needles 24 and a large needle 25) extending downward and arranged in a matrix pattern consisting of three rows and three lines. The large needle 25, positioned at the center, has an inner diameter larger than that of small needles 24 disposed in the periphery of large needle 25. Hence, large needle 25 can supply a larger amount of bond 2 compared with small needles 24.

The bond applicator head 21, shiftable in both horizontal and vertical directions with respect to substrate 1, moves along an arrow "c" to apply a plurality of semi-spherical bonding bumps 2 in a predetermined pattern in each subsection "E". Then, chip 3, absorbed by vacuum at a collet 16 of a die bonder, is mounted on the bonding bumps 2 as shown by an arrow "c".

Figure 8:
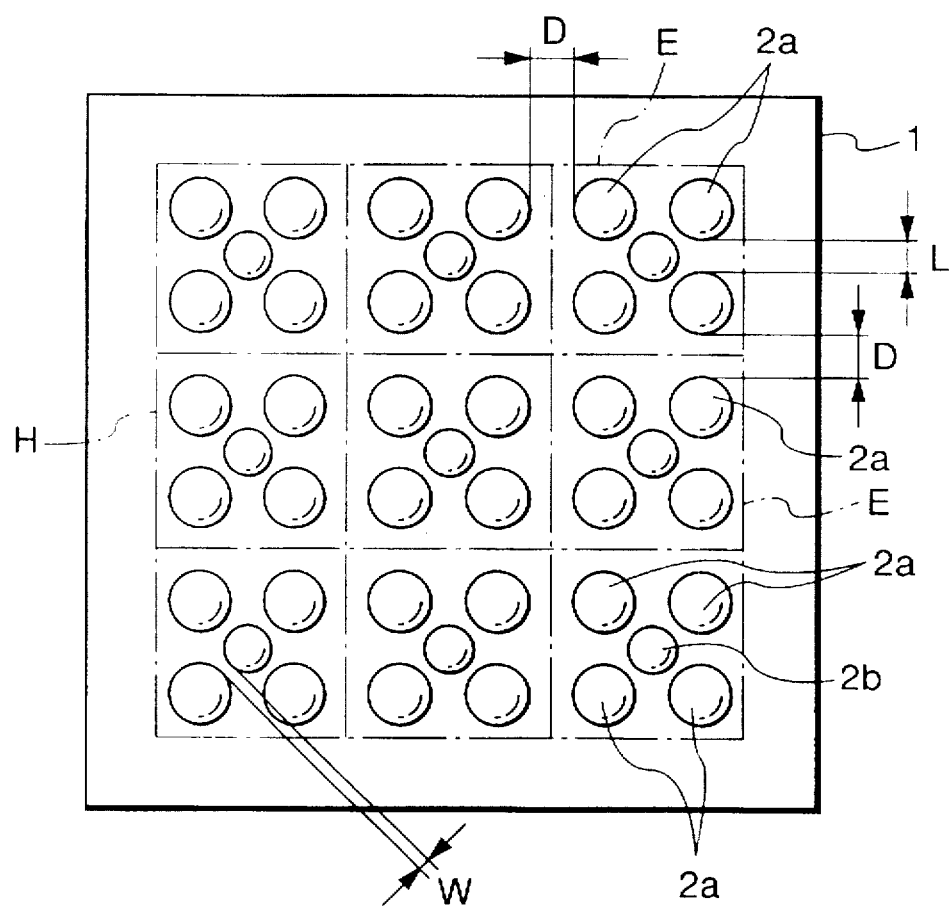
FIG. 8 is a plan view illustrating a chip bonding method in accordance with a second embodiment of the present invention.

FIG. 8 shows a chip bonding method in accordance with a second embodiment of the present invention. A square chip mounting section "H" is uniformly dissected into nine subsections "E" in a 3×3 matrix pattern. In each subsection "E", a plurality of (a total of four) large bonding bumps 2a and a small bonding bump 2b are provided. Although not shown in the drawing, the shape of each bonding bump is semi-spherical in the same manner as the first embodiment. In each subsection "E", four large bonding bumps 2a are arranged in a matrix pattern of two rows and two lines. One small bonding bump 2b is disposed at the center of each subsection "E" so as to be surrounded by four large bonding bumps 2a. The small bonding bump 2b is smaller in both volume and diameter than the large bonding bump 2a.

A distance "L" represents a minimum clearance between adjacent two large bonding bumps 2a and 2a when these two belong to the same subsection "E" and same in size. A distance "D" represents a minimum clearance of two large bonding bumps 2a and 2a, when these two belong to different subsections "E" and "E" next to each other and are the most closest bumps 2a between these two subsections "E" and "E". The minimum clearance "L" is smaller than the minimum clearance "D".

When a chip 3 (not shown in FIG. 8) is mounted on the bonding bumps 2a and 2b thus applied on a substrate 1, large bonding bumps 2a and 2a are crushed or mashed first in each subsection "E". A central region surrounded by four bonding bumps 2a is a region where a void is easily formed if no bonding bump is provided. However, according to the second embodiment, single small bonding bump 2b is provided in the central region. Hence, no void is generated. In this respect, small bonding bump 2b has a function of suppressing any void from being generated. A distance "W" represents a minimum clearance between central small bonding bump 2b and each of large bonding bumps 2a. It is desirable that the minimum distance "W" is smaller than the minimum distance "L".

While a pressing force is continuously applied on chip 3, remaining one small bonding bump 2b starts expanding flatly following the large bonding bumps 2a in each subsection "E". Then, small bonding bump 2b is merged with large bonding bumps 2a, forming a united bonding block in each subsection "E". Thus, air is successfully pushed out from the subsection "E" to the outside, in the same manner as in the first embodiment.

Figure 9:
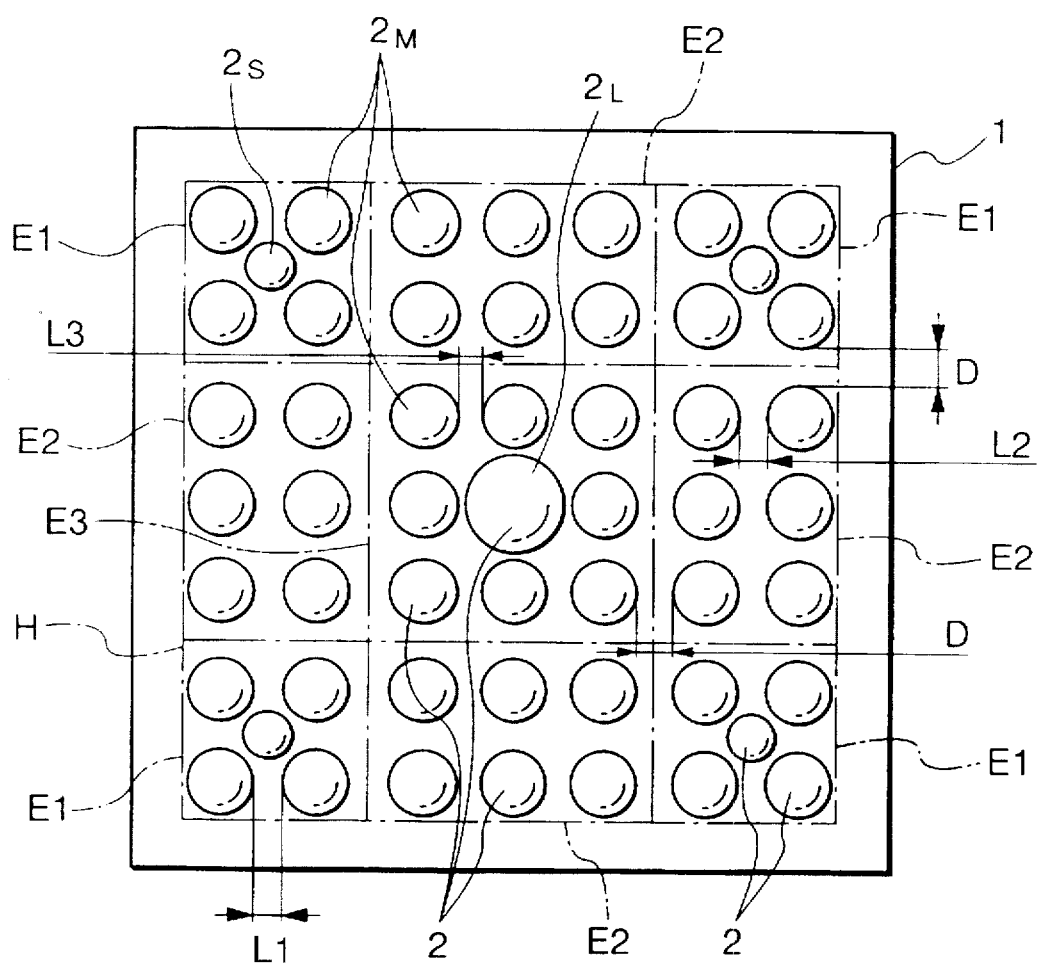
FIG. 9 is a plan view illustrating a chip bonding method in accordance with a third embodiment of the present invention.
Figure 10:
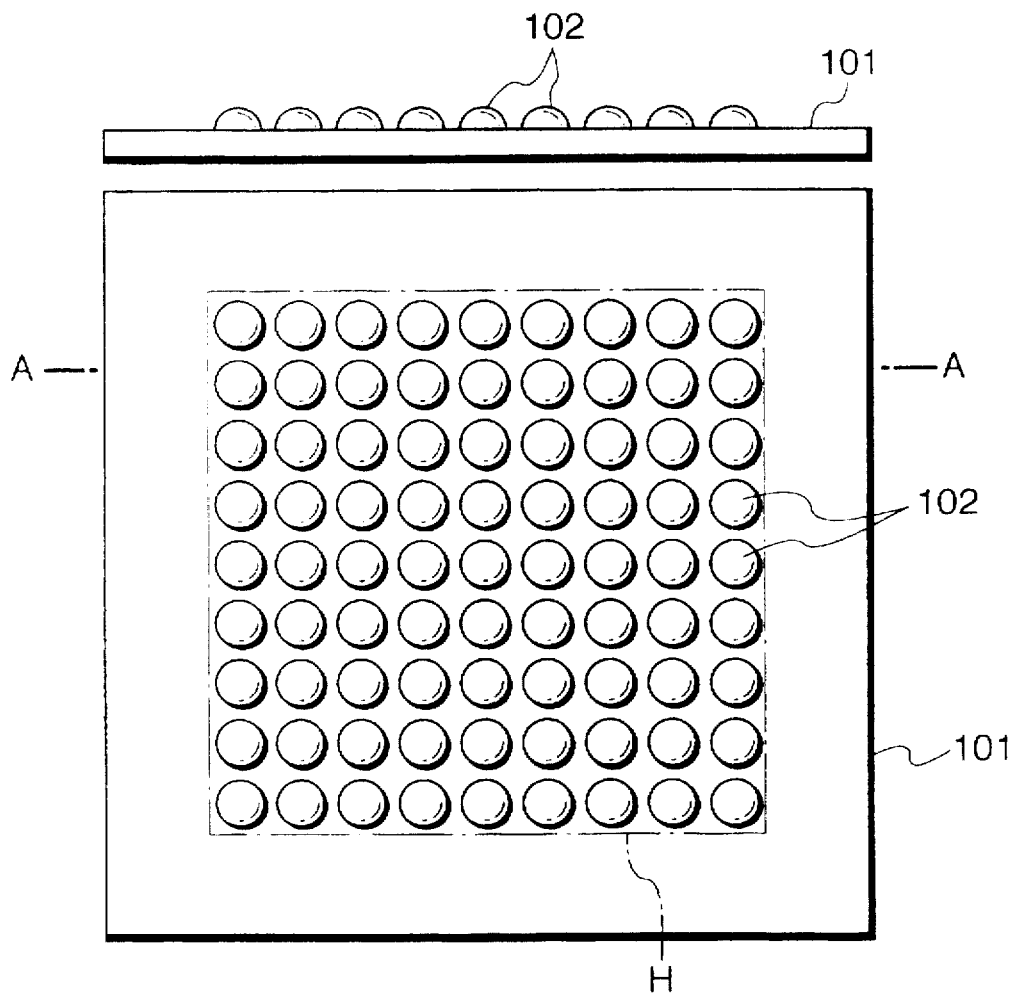
FIG. 10 is the composite view illustrating the conventional chip bonding method, wherein top is a cross-sectional side view taken along the line A—A while bottom is the plan view showing a substrate and an arrangement of bond applied thereon.
Figure 11:
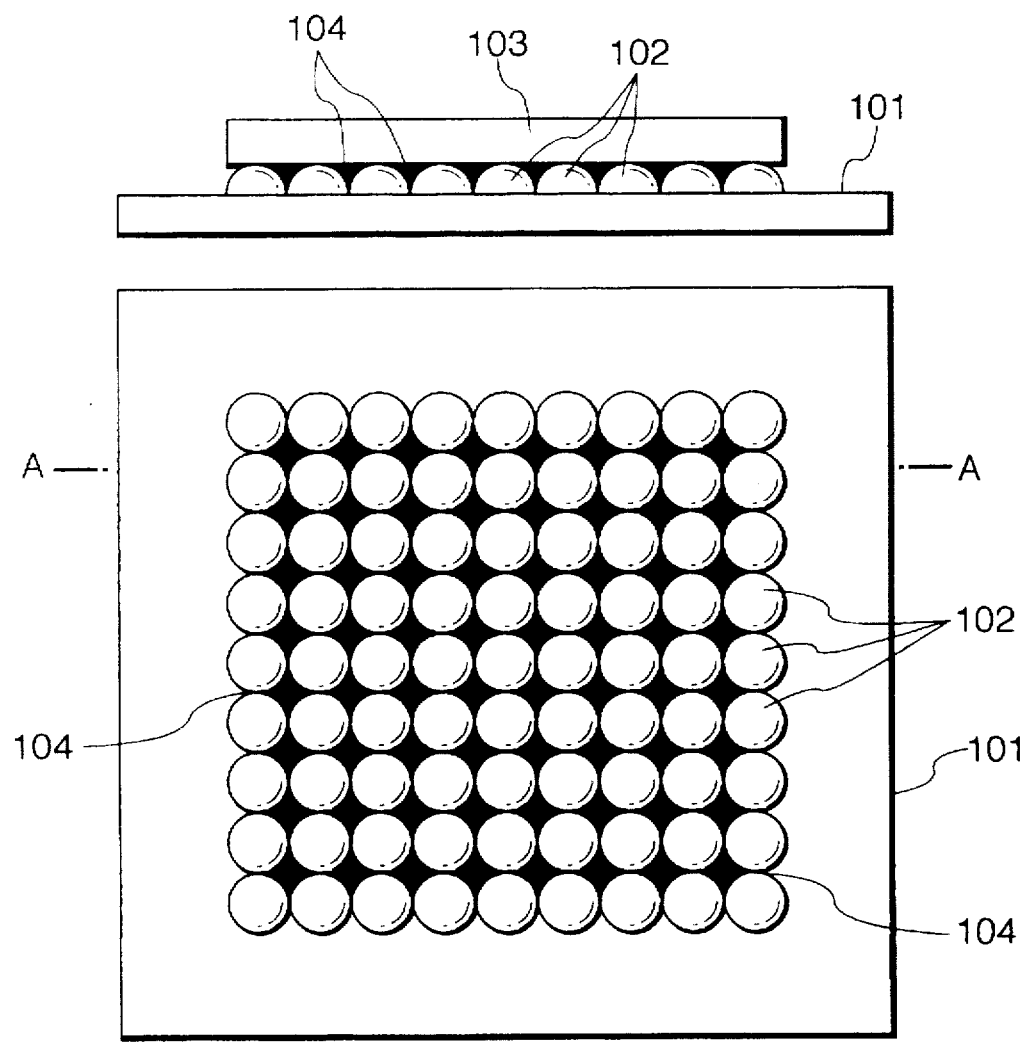
FIG. 11 is the composite view illustrating the conventional chip bonding method, wherein top is a cross-sectional side view taken along the line A—A while bottom is the plan view showing a final condition of the bond applied on the substrate.

FIG. 9 shows a chip bonding method in accordance with a third embodiment of the present invention. A square chip mounting section "H" is dissected into nine subsections in a predesignated 3×3 matrix pattern, containing three kinds of subsections "E1", "E2" and "E3". A total of four subsections "E1" are disposed at four corners of the square chip mounting section "H". A total of four subsections "E2" are interposed between subsections "E1" and "E1" along four sides of the square chip mounting section "H". One subsection "E3" is disposed at the center of the square chip mounting section "H".

Subsections "E1" and "E3" are respectively small and large right squares, while subsection "E2" is a rectangle having a short side identical with the side of square subsection "E1" and a long side identical with the side of square subsection "E3". Application patterns of plural bonding bumps 2 in subsections "E1", "E2" and "E3" are differentiated but are functionally equivalent in that no void is formed in each subsection when these bonding bumps 2 are mashed or flattened.

In each of subsections "E1", "E2" and "E3", a plurality of bonding bumps 2 are provided. Although not shown in the drawing, the shape of each bonding bump 2 is semi-spherical in the same manner as the first embodiment. Subsection "E1" comprises four medium bonding bumps $2_M$ and a single small bonding bump $2_S$ arranged in the same pattern as in the second embodiment. Subsection "E3" comprises eight medium bonding bumps $2_M$ and a single large bonding bump $2_L$ arranged in the same pattern as in the first embodiment. Subsection "E2" comprises six medium bonding bumps $2_M$ arranged in a 2×3 matrix pattern.

Distances "L1", "L2" and "L3" represent minimum clearances between two same-size bonding bumps 2 and 2 in subsections "E1", "E2" and "E3", respectively. A distance "D" represents a minimum clearance of two bonding bumps 2 and 2, when these two belong to different subsections (i.e. two of subsections "E1", "E2" and "E3") next to each other and are the most closest bumps 2 between these two subsections. Each of the minimum clearances "L1", "L2" and "L3" is set smaller than the minimum clearance "D". When a chip 3 (not shown in FIG. 9) is mounted on the bonding bumps 2 thus applied on a substrate 1 and a pressing force is continuously applied on chip 3, plural bonding bumps 2 start expanding flatly and are merged into a united bonding block in each subsection "E", since these plural bonding bumps 2 have a function of suppressing any void from being generated therebetween. Thus, air is successfully pushed out from the subsection "E" to the outside, in the same manner as in the first embodiment.

As apparent from the foregoing, according to the present invention, it becomes possible to suppress or prevent the formation of void inside the space between a chip and a substrate.

As this invention may be embodied in several forms without departing from the spirit of essential characteristics thereof, the present embodiments described are therefore intended to be only illustrative and not restrictive, since the scope of the invention is defined by the appended claims rather than by the description preceding them, and all changes that fall within metes and bounds of the claims, or equivalents of such metes and bounds, are therefore intended to be embraced by the claims.

What is claimed is:

1. A method of bonding a chip on a substrate, comprising steps of:

dissecting a chip mounting section defined on a flush surface of said substrate into a plurality of subsections;

applying bond within the chip mounting section on said flush surface of said substrate in a discrete manner so that a plurality of bonding bumps are arranged within each region of said subsections, wherein a minimum clearance between two bonding bumps in the same subsection being smaller than a minimum clearance between two bonding bumps belonging to adjacent to subsections; and mounting a chip on said plurality of bonding bumps by applying a force thereon, thereby mashing said plurality of bonding bumps by a bottom surface of said chip.

2. The method in accordance with claim 1, wherein said chip mounting section defined on the flush surface of said substrate is a square region.

3. The method in accordance with claim 2, wherein said chip mounting section is dissected into said plural subsections in a predetermined matrix pattern.

4. The method in accordance with claim 3, wherein said matrix pattern comprises the same number of rows and lines.

5. The method in accordance with claim 4, wherein each of subsections is a right square.

6. The method in accordance with claim 1, wherein said plural bonding bumps arranged within each region of said subsections are arranged in a predetermined matrix pattern.

7. The method in accordance with claim 1, wherein said plural bonding bumps arranged within each region of said subsections consist of a central bonding bump and a plurality of surrounding bonding bumps disposed symmetrically about said central bonding bump.

8. The method in accordance with claim 7, wherein said central bonding bump is different in size from said surrounding bonding bumps.

9. The method in accordance with claim 8, wherein said central bonding bump is larger in size than said surrounding bonding bumps, and a total of eight surrounding bonding bumps are disposed around said central bonding bump so as to form a matrix pattern consisting of three rows and three lines.

10. The method in accordance with claim 8, wherein said central bonding bump is smaller in size than said surrounding bonding bumps, and a total of four surrounding bonding bumps are disposed in a matrix pattern of two rows and two lines so as to surround said central bonding bump.

11. The method in accordance with claim 10, wherein a minimum clearance between said central bonding bump and each of said surrounding bonding bump is smaller than a minimum clearance between two surrounding bonding bumps.

12. The method in accordance with claim 1, wherein said plural bonding bumps are formed into a semi-spherical shape.

13. The method in accordance with claim 1, wherein said minimum clearance between two bonding bumps in the same subsection is a minimum clearance between two bonding bumps having the same size.

14. The method in accordance with claim 1, wherein said subsections comprises first and second subsections, said first subsection comprises a first central bonding bump larger than each of first surrounding bonding bumps disposed symmetrically about said first central bonding bump, while said second subsection comprises a second central bonding bump smaller than each of second surrounding bonding bumps disposed symmetrically about said second central bonding bump.

* * * * *